United States Patent [19]

Hawrylo

[11] Patent Number: 4,484,332
[45] Date of Patent: Nov. 20, 1984

[54] MULTIPLE DOUBLE HETEROJUNCTION BURIED LASER DEVICE

[75] Inventor: Frank Z. Hawrylo, Trenton, N.J.

[73] Assignee: The United States of America as represented by the Secretary of the Air Force, Washington, D.C.

[21] Appl. No.: 384,292

[22] Filed: Jun. 2, 1982

[51] Int. Cl.$^3$ .............................................. H01S 3/19
[52] U.S. Cl. ...................................... 372/50; 372/45; 372/46
[58] Field of Search ...................... 372/50, 46, 45, 44; 357/17, 71

[56] References Cited

U.S. PATENT DOCUMENTS

| | | | |
|---|---|---|---|
| 3,978,428 | 8/1976 | Burnham et al. | 331/94.5 H |
| 3,983,510 | 9/1976 | Hayashi et al. | 331/94.5 H |
| 3,993,964 | 11/1976 | Yonezu | 331/94.5 H |
| 4,033,796 | 7/1977 | Burnham et al. | 148/175 |
| 4,179,534 | 12/1979 | Chang et al. | 357/71 |
| 4,233,090 | 11/1980 | Hawrylo et al. | 198/171 |
| 4,321,617 | 3/1982 | Duda et al. | 357/71 |
| 4,371,968 | 2/1983 | Trussel et al. | 372/50 |

OTHER PUBLICATIONS

Tsang et al., "A Densely Packed Monolithic Linear Array of GaAs-Al$_x$Ga$_{1-x}$As Strip Buried Heterostructure Laser", APL 34(2), 15 Jan. 1979, pp. 162-165.

Primary Examiner—James W. Davie
Attorney, Agent, or Firm—Donald J. Singer; Stanton E. Collier

[57] ABSTRACT

A multiple double heterojunction buried laser device is formed of a bulk structure, a plurality of double heterojunction buried lasers and electrical means. The bulk structure includes, in order, an InP:Sn substrate, an InP:Te first layer, an InP:Zn second layer, an InP:Te third layer, and a capping n-type fourth layer. Multiple stripe-like openings are formed in the above layers and double heterojunction buried lasers are formed therein. The double heterojunction buried lasers include the following layers in order: an InP:Te heterojunction first layer, an InGaAsP quarternary second layer, an InP:Zn heterojunction third layer, and an InGaAsP:Zn capping fourth layer. A reverse biased junction is formed in said bulk structure so that current is confined to the lasers; the active lasing regions are above the p-type layers of the p-n reversed bias junction. The double heterojunction buried lasers can be cleaved from the laser device and operated as a single device.

10 Claims, 5 Drawing Figures

MULTIPLE DOUBLE HETEROJUNCTION BURIED LASER DEVICE

STATEMENT OF GOVERNMENT INTEREST

The invention described herein may be manufactured and used by or for the Government for governmental purposes without the payment of any royalty thereon.

BACKGROUND OF THE INVENTION

This invention relates generally to lasers, and more particularly, to semiconductor lasers and a method of fabricating these lasers.

A semiconductor laser and method of fabricating such a device having a double heterojunction is shown in U.S. Pat. No. 4,233,090 to F. Z. Hawrylo et al entitled, "METHOD OF MAKING A LASER DIODE," issued Nov. 11, 1980 and is incorporated herein by reference. This and other patents have described a single laser device and the method of fabricating the same. Although these have accomplished their desired goal, a laser device having a plurality of lasers therein is highly desirable from a fabrication point of view because of cost saving and also the additional possibility of having an operable array of lasers connected to fiber optic cables.

Clearly, many problems are encountered in making a multiple laser device structure. One of the major problems is current confinement. Current must flow through the laser structure, not the surrounding support structure, so as to achieve lasing action and reduce overall current requirements. A high current tends to reduce the life because of heating and diffusing of dopants. Thus, the support structure surrounding the laser structures must block current flow so as to channel the current through the laser structures. Another problem associated with the support structure is the diffusion of the p-type dopant into the n-type layers which may eliminate the reverse bias on the p-n junction. An additional problem is the confinement of lasing light to the laser structures by adjustment of refractive indexes of adjacent materials.

SUMMARY OF THE INVENTION

A multiple double heterojunction (DH) buried laser device is made by epitaxially depositing in succession on a substrate a plurality of layers of single crystalline semiconductor material to form a bulk structure. After the deposition of the plurality of layers, a plurality of stripe-like openings are formed therein by etching into the bulk structure; DH lasers are deposited into these stripe-like openings. The portion of the bulk structure between adjacent DH buried lasers acts as a current block when forward biased and further confines the lasing light in the laser structure. Electrical contact layers are formed on the multiple DH buried laser device.

One object of this invention is to provide a reverse biased junction through the use of highly doped n-type layers that prevent the diffusion of p-type dopants;

Another object of this invention is to provide for a laser light confining material by the use of highly doped semiconductor material;

Another object of this invention is to provide a protective layer on the substrate to stop the dissociation of the material therefrom during fabrication;

Another object of this invention is to provide for a diffusion zone around the capping layer of the DH buried laser;

Another object of this invention is to provide a method of fabricating a plurality of laser devices on a single substrate;

Another object of this invention is to provide a laser device having a narrower laser beam divergence for more efficient coupling to optical filters; and Another object of this invention is to provide a laser structure having a plurality of lasers therein which can be operated in an array mode or in a single mode from each other.

These and many other objects and advantages of the present invention will be readily apparent to one skilled in the art to which the invention pertains from a perusal of the claims and of the following detailed description of a preferred embodiment of the invention when considered in conjunction with the drawings.

DETAILED DESCRIPTION OF A PREFERRED EMBODIMENT

Figure 1:
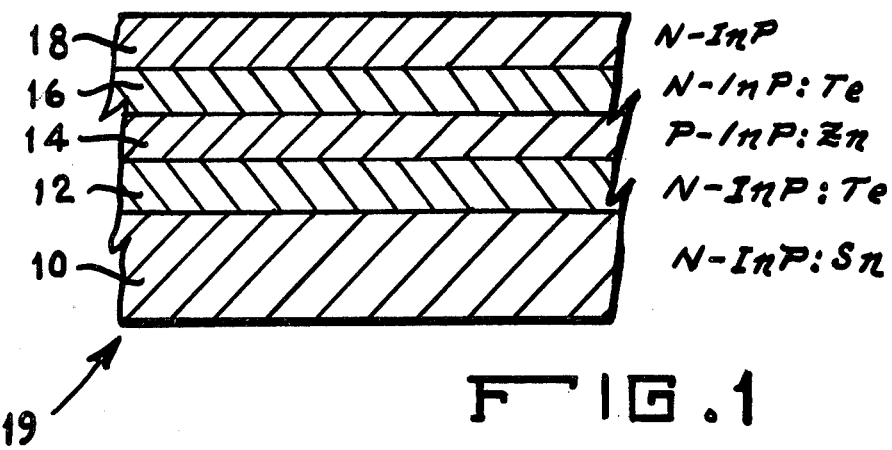
FIG. 1 is a cross-section of the bulk structure of this invention.

In making a multiple double heterojunction (DH) buried laser device of this invention a bulk structure is constructed of a plurality of semiconductor layers deposited in succession on a substrate. The bulk structure then has a plurality of stripe-like openings cut into the bulk structure by conventional photolithographic techniques. The DH lasers are grown into the stripe-like openings by depositing a plurality of semiconductor layers therein. After removal of extraneous material, electrical contact layers are deposited on the multiple DH buried laser device. At this point in the fabrication, the individual DH-buried laser devices can be separated and used individually or as an array. The bulk structure and lasers are composed of a Group III-V compound or alloys of such compounds. The present invention will be described using, in particular, InP and InGaAsP as the materials for the various layers using appropriate n-type or p-type dopants in the appropriate layers. Although various epitaxial techniques can be used for depositing the layers, a preferred technique is liquid phase epitaxy (LPE).

A suitable apparatus and method for depositing the layers by liquid phase epitaxy is shown and described in U.S. Pat. No. 3,753,801 to H. F. Lockwood et al entitled, "METHOD OF DEPOSITING EPITAXIAL SEMICONDUCTOR LAYERS FROM THE LIQUID PHASE", issued Aug. 21, 1973 which is incorporated herein by reference. Basically, the apparatus includes a furnace boat having a plurality of spaced wells in the top surface thereof and a substrate-carrying slide movable through the furnace boat and across the bottom of each of the wells. Each of the wells contains a liquid source from which a layer is to be deposited. The slide carries the substrate into each of the wells where it is brought into contact with the source to permit the layer to be deposited on the substrate or other layers already deposited. For depositing thin layers, small amounts of the solution are used in the well and a weight is placed on the solution to spread the solution completely across the substrate.

Each of the source solutions is made-up of the desired semiconductor material and a suitable conductivity modifier dissolved in a metal solvent. The solutions are heated to a temperature at which the semiconductor material and the conductivity modifier are completely dissolved in the solvent. The substrate is moved into each of the wells in succession and, while in contact with the solution in the well, the temperature of the solution is lowered to precipitate out the semiconductor material and deposit it on the surface of the substrate. The deposition of the semiconductor material also carries along some of the conductivity modifier. Prior to placing the substrate in the solution, the solution is generally saturated with the semiconductor material by means of a source wafer of the semiconductor material which is either carried by the slide ahead of the substrate or is within the well on top of the solution.

Referring to FIG. 1, bulk structure 19 includes a substrate 10 of n-type InP doped with tin. The same reference numerals will be used in all the Figures to identify identical elements. A first layer 12 of n-type InP doped with tellurium is deposited upon substrate 10. The purpose of protective first layer 12 is more fully described in U.S. patent application Ser. No. 384,291, entitled, "InP:Te PROTECTIVE LAYER FOR REDUCING SUBSTRATE DISSOCIATION," filed on June 2, 1982 by the present inventor. This application discloses that first layer 12 of indium phosphide doped with tellurium on an indium phosphide substrate substantially reduces the formation of indium droplets thereon and pitting caused by dissociation of phosphorous from the InP substrate during the LPE technique. The deposition of first layer 12 involves forming a melt solution of In, InP, and Te, homogenizing the melt solution, wiping substrate 10 with an indium solution, and depositing a layer of InP doped with Te upon substrate 10 after the indium wipe. This first layer 12 is deposited by supercooling the growth melt from about 645° C. to about 635° C. The concentration of Te ranges from about high $10^{18}$ to low $10^{19}$ atoms per cubic centimeter.

Figure 3A:
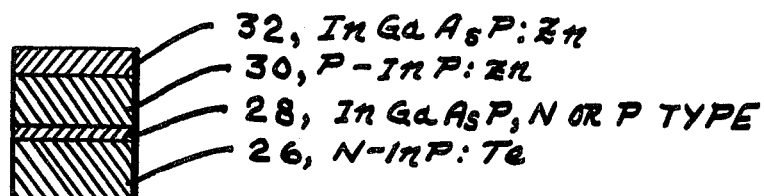
FIG. 3A is a cross-section of a double heterojunction laser of this invention.

Following layer 12, a second layer 14 of p-type InP doped with zinc is deposited therein. A third layer 16 of n-type InP doped with tellurium is deposited on second layer 14. When a positive voltage is applied across a laser 34 as shown in FIG. 3A, the bulk p-n junction will be reverse biased and stop the flow of current. This feature is required to confine current flow through structures to be defined hereinafter.

The tellurium doping in first layer 12 and third layer 16 substantially block the diffusion of zinc from second layer 4. The diffusion barrier to zinc is more fully described in U.S. patent application, Ser. No. 372,364, entitled, "DIFFUSION BARRIER FOR LONG WAVELENGTH LASER DIODES," filed on Apr. 27, 1982 by the present inventor. These layers include Group VI elements such as sulfur, selenium, or tellurium for dopants in the n-type layers. These dopants when properly introduced into the n-type layers, which for example can be heterojunction layers in a laser, provide a higher donor concentration than the acceptor doping levels which are controlled by the amount of zinc added by weight to the p-type layer solution. These n-type layers 12 and 16 act as a barrier to the diffusion of acceptors into the n-type layers. The concentration of Group VI dopants is about high $10^{19}$. Referring to FIG. 1, it is seen that first layer 12 and third layer 16 are doped with tellurium. Second layer 14 having zinc is between layers 12 and 16 thus there is no diffusion of zinc therefrom and there is an abrupt interface between first, second, and third layers 12, 14, and 16 respectively. A capping fourth layer 18 of n-type InP doped or undoped is deposited on third layer 16.

Figure 2:
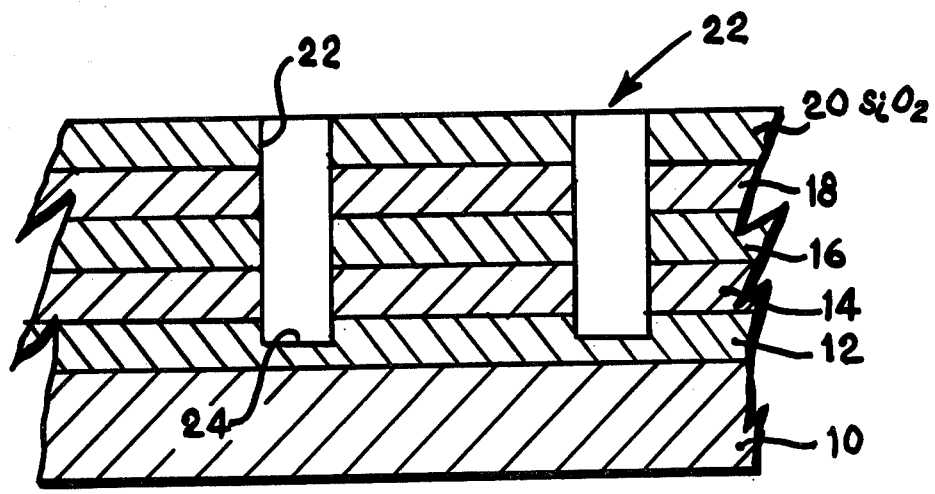
FIG. 2 is a cross-section of the bulk structure of this invention as shown in FIG. 1 wherein stripe-like openings are formed in the bulk structure.

After the semiconductor layers 12 to 18 are deposited on substrate 10, bulk structure 19 is removed from the furnace boat. A masking layer 20, shown in FIG. 2, such as silicon dioxide, is then deposited on the surface of fourth layer 18. Silicon dioxide layer 20 can be deposited by the conventional technique of chemical vapor deposition, such as heating silane in an atmosphere containing oxygen at a temperature at which the silane decomposes to form silicon oxide which then deposits on fourth layer 18. As shown in FIG. 2, a plurality of stripe shaped openings 22 are then formed in masking layer 20. This is achieved by forming a photoresist layer on masking layer 20 and then developed to form openings 22 using conventional photolithographic techniques, and then etching away the exposed portion of masking layer 20. Further etching removes semiconductor material from fourth, third, second, and first layers 18, 16, 14, and 12, respectively, to a depth where a bottom 24 of openings 22 is in n-type layer 12. Bottom 24 can not stop in p-type layers because a reverse biased junction would result from the semiconductor material deposited in openings 22 or result in a higher device series resistance, as will be shown.

Referring to FIG. 3A double heterojunction laser 34 such as the one shown are formed in openings 22. A related structure is shown and described in U.S. Pat. No. 4,233,090, mentioned above. In the present DH laser 34, an n-type InP first layer 26 is deposited on a substantially planar bottom 24 of openings 22. First layer 26 is doped with tellurium. As noted above, InP doped with tellurium served to stop the dissociation of phosphorous from InP thus preventing the formation of indium droplets. If bottom 24 occured on the surface of substrate 10 of InP, the above feature especially prevents the indium droplets; otherwise, layer 26 is substantially adjacent first layer 12 of InP doped with tellurium. A laser region second layer 28 forms the active region of laser 34, second layer 28 is normally about 2000 angstroms thick. In this embodiment, a quaternary alloy of InGaAsP forms laser region second layer 28. If other alloys or materials are used to form second layer 28 such as GaAs, the adjacent heterojunction layers can be composed of AlGaAs, for example. A heterojunction third layer 30 of p-type InP doped with the acceptor zinc is deposited on laser region second layer 28. A capping fourth layer 32 of p-type InGaAsP doped with zinc is deposited on heterojunction third layer 30 which is at a lower bandgap and higher acceptor concentration so that zinc diffusion therefrom increases the acceptor concentration of the underlying p-layer surface of laser 34 for lower series resistance.

Figure 3B:
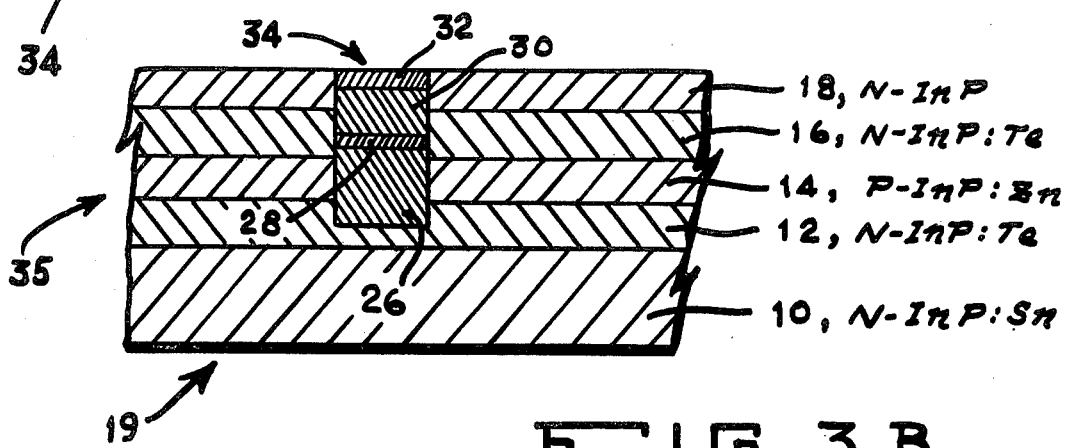
FIG. 3B is a cross-section of a double heterojunction buried laser device combining the laser of FIG. 3A and a portion of the support structure of FIG. 2.

FIG. 3B shows DH buried laser 34 in bulk structure 19 forming a DH buried laser 35. The width of laser 34 is about 0.5 mils. Of critical importance is the requirement that laser region second layer 28 abut highly doped third layer 16 of bulk structure 19. Highly doped layers 16, 26 and 30 enhance both optical and electrical confinement due to controlability of their energy bandgap and refractive index properties which can also be varied. This configuration confines current to flow through laser 34 when it is buried in bulk structure 19 and lasing light is also confined to laser region second layer 28 therein because of the changes in the index of refraction at the interfaces to layer 28. Possible dopants to achieve high dopant levels are Group VI elements such as tellurium, selenium, or sulfur.

After DH lasers 34 are deposited into openings 22, masking layer 20 is removed with a suitable etchant. The etchant used should have little or no effect on capping fourth layer 18 of bulk structure 19 and capping fourth layer 32 of laser 34.

Figure 4:
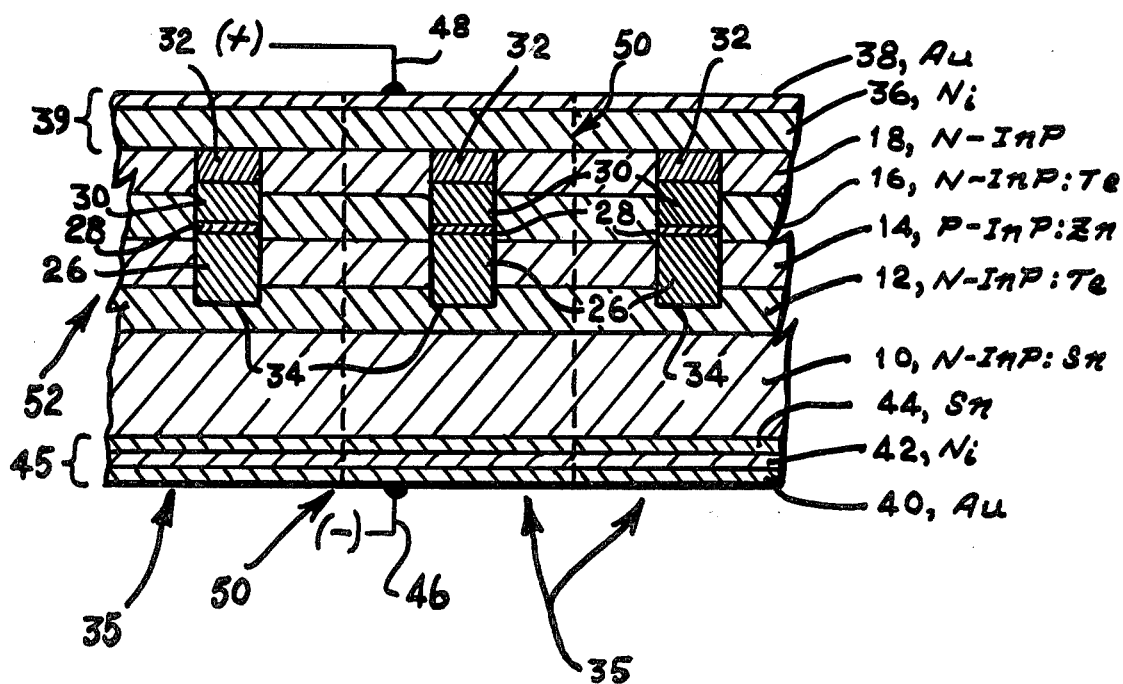
FIG. 4 is a cross-section of a multiple double heterojunction buried laser device of this invention having a plurality of the DH laser devices of FIG. 3B.

Referring to FIG. 4, metal contacts 39 and 45 are then deposited on the surface of capping fourth layer 18 of bulk structure 19, capping fourth layer 32 of lasers 34, and substrate 10. Metal contacts 39 and 45 may be of any metal which forms an operable ohmic contact with the particular material involved. For n-type InP substrate 10, a metal contact 45 includes a layer 44 of tin alloyed to InP substrate 10, followed by a layer 42 of nickel and lastly coated with a layer 40 of gold. These have been found to be suitable. For contact 39, a layer 36 of nickel is deposited onto fourth layers 18 and 32 and covered with a thin layer 38 of gold is suitable.

In use, a multiple DH buried laser device 52 can be operated as an array wherein a positive lead 48 and a negative lead 46 supply current to operate lasers 34 which can be connected to a plurality of optical fibers (not shown).

In order to operate the laser 34 as a single device, individual DH-buried lasers can be cleaved in a conventional manner along dotted lines 50. An alternative method could place conventional current barriers (not shown) between lasers 34 in bulk structure 19. Thus individual input lines (not shown) could operate each laser 34 independently of one another while these lasers 34 remain on a common substrate 10.

Obviously, many modifications and variations of the present invention are possible in light of the above teachings and it is therefore understood that, within the scope of the disclosed inventive concept, the invention may be practiced otherwise than specifically described.

What is claimed is:

1. A double heterojunction buried laser comprising:
   a bulk structure having a plurality of semiconductor layers deposited on a substrate and a stripe-like opening formed in said bulk structure through said plurality of layers, said bulk structure semiconductor layers including a first layer deposited on said substrate, said first layer preventing the formation of metallic droplets on said substrate and preventing the diffusion of Group II acceptor dopants therein, said first layer composed of an alloy of Group III-V elements and doped n-type with Group VI elements; a second layer deposited on said first layer, said second layer composed of an alloy of Group III-V elements and doped p-type with a Group II element, said second layer being the p-type material in a p-n junction that blocks the flow of current when said buried laser is forward biased; a third layer deposited on said second layer, said third layer composed of an alloy of Group III-V elements and doped n-type with Group VI elements, said third layer being the n-type material of said p-n junction, and said third layer being a diffusion barrier to the acceptor dopants of said second layer; and a capping fourth layer deposited on said third layer, said fourth layer composed of an alloy of Group III-V elements, said fourth layer facilitating current flow;
   a double heterojunction laser deposited in said stripe-like opening, said laser having a substantially planar face from which lasing light emits, said laser including a plurality of semiconductor layers, said semiconductor layers including a heterojunction first layer deposited on a bottom side of said stripe-like opening, said heterojunction first layer composed of an alloy of Group III-V elements and doped n-type with Group VI elements, said first layer acting as a diffusion barrier to acceptor dopants; a laser region second layer deposited on said heterojunction first layer, said laser region second layer composed of an alloy of Group III-V elements, said laser region second layer being the active region for lasing action and forming resonant cavity means, said laser region second layer abutting on the sides of said third layer of said bulk structure; a heterojunction third layer deposited on said laser region second layer, said third layer composed of an alloy of Group III-V elements and doped p-type with Group II elements; and a capping fourth layer deposited on said heterojunction third layer, said capping fourth layer composed of an alloy of Group III-V elements, the top of said capping fourth layer being substantially coincident with the top of said capping fourth layer of said bulk structure; and
   electrical means for providing current paths through said bulk structure and said laser, said electrical means deposited on said bulk structure and said laser.

2. A double heterojunction buried laser as defined in claim 1 wherein said alloy of Group III-V elements is InP.

3. A double heterojunction buried laser as defined in claim 1 wherein said n-type dopants are selected from the group consisting of sulfur, selenium, or tellurium.

4. A double heterojunction buried laser as defined in claim 1 wherein said p-type dopant is selected from the group consisting of zinc, cadmium or magnesium.

5. A double heterojunction buried laser as defined in claim 1 wherein said substrate is composed of an alloy of Group III-V elements and doped n-type with a Group IV element.

6. A double heterojunction buried laser as defined in claim 5 wherein said substrate is InP doped n-type with tin.

7. A double heterojunction buried laser as defined in claim 1 wherein said stripe-like opening is a substantially rectangular void formed in said plurality of layers, said bottom side of said stripe-like opening being substantially parallel to a planar surface of said substrate, said bottom side being within said first layer such that no p-type material is near said bottom side, a top side of said stripe-like opening substantially coincident with a top surface of said fourth layer of said bulk structure and the other sides being substantially perpendicular to the planar surface of said substrate.

8. A double heterojunction buried laser as defined in claim 1 wherein said Group III-V elements are selected from the group consisting of indium, phosphorous, gallium or arsenic, said n-type Group VI dopant selected from the Group consisting of sulfur, selenium or tellurium, and said p-type Group II dopant selected from the group consisting of zinc, cadmium or magnesium.

9. A double heterojunction buried laser as defined in claim 1 wherein said electrical means comprises a plurality of metal contact layers.

10. A double heterojunction buried laser as defined in claim 9 wherein said plurality of metal contact layers comprise at least one negative contact layer deposited on said substrate comprising a tin layer deposited on said substrate, a nickel layer deposited on said tin layer, and a gold layer deposited on said nickel layer whereby a negative electrical connection can be made, and at least one positive contact layer deposited on said bulk structure and said double heterojunction laser, said positive contact layer comprising a nickel layer deposited firstly and a gold layer deposited on said nickel layer.

* * * * *